United States Patent [19]

Boutigny et al.

[11] Patent Number: 5,177,483
[45] Date of Patent: Jan. 5, 1993

[54] MULTILEVEL CONFIGURABLE LOGIC ANALYZER

[75] Inventors: Pierre-Henri Boutigny, Epinay Sous Senart; Huy A. Nguyen, Paris; Denis Raoulx, Grigny, all of France

[73] Assignee: U.S. Philips Corporation, New York, N.Y.

[21] Appl. No.: 367,528

[22] Filed: Jun. 16, 1989

[30] Foreign Application Priority Data

Jun. 17, 1988 [FR] France .................. 88 08144

[51] Int. Cl.⁵ .................. H03M 1/36; G05B 23/02
[52] U.S. Cl. .................. 341/159; 364/579
[58] Field of Search .................. 341/56, 57, 78, 83, 341/155, 159; 364/486, 579

[56] References Cited

U.S. PATENT DOCUMENTS

| | | | |
|---|---|---|---|
| 4,243,976 | 1/1981 | Warner et al. | 341/57 |
| 4,373,152 | 2/1983 | Jacobsthal | 341/56 |
| 4,493,044 | 1/1985 | Hoeren et al. | 364/579 |
| 4,549,165 | 10/1985 | Brian | 341/155 |
| 4,602,374 | 7/1986 | Nakamura et al. | 375/17 |
| 4,803,423 | 2/1989 | Boutigny | 324/130 |

FOREIGN PATENT DOCUMENTS 3120622 12/1982 Fed. Rep. of Germany.
1447291 8/1976 United Kingdom.

OTHER PUBLICATIONS

French search report in corresponding application, French Serial No. 88-08144.
Zellmer et al, "A Modular Logic Timing Analyzer for the 64000 System", Hewlett-Packard Journal, Mar. 1983, pp. 23-30.
"The Diagnostic Probe System", IBM Tech. Discl. Bull, vol. 30, No. 2, Jul. 1987, pp. 547-548.

Primary Examiner—A. D. Pellinen
Assistant Examiner—Marc S. Hoff
Attorney, Agent, or Firm—Anne E. Barschall

[57] ABSTRACT

A logic analyzer is provided with probes (20) deriving the signals to be tested which are introduced into a digitizer (22) provided with comparators which carry out a digitization according to a logic system having two states. It comprises a change-over circuit (21) arranged between the probe and the digitizer, which permits associating several or all comparators with a given signal to be tested to extend its digitization to a multi-level logic system. The change-over circuit (21) is constituted by a matrix of MOS transfer gates or field effect transistors (FET's). When the multi-level logic system has at least one medium state limited by two references, the medium state is displayed on a display device (24) according to a straight line or a monotonic curve joining the two references between the beginning and the end of the medium state. When the duration of the medium state exceeds a predetermined duration, the display device (24) is switched on to display the medium state.

8 Claims, 3 Drawing Sheets

MULTILEVEL CONFIGURABLE LOGIC ANALYZER

The invention relates to a logic analyser provided with probes sensing the signals to be tested, which are introduced into a digitizer provided with comparators which carry out a digitization according to a logic system having two states.

An invention of this kind is described in the document U.S. Pat. No. 4,493,044, which discloses an apparatus and a method of establishing the order in which the different signals sensed by the probes must be displayed in a logic analyser. The different probes supply their signals to a digitization member, which operates according to a logic system having two states. The digitized signals are then stored in a memory. However, when the device being tested is complex, it may be necessary to use a large number of probes and the task of positioning the probes is therefore difficult. During the display of the digitized signals on a screen, the order of appearance can necessitate certain changes. According to this document, instead of modifying the positions of the probes on the device being tested, it is proposed to carry out the permutations at the level of the logic analyser itself and hence in ultimate form on the screen. However, the digitized signals stored in a memory remain unchanged and only the display of these signals is influenced.

It may be useful if a given signal to be tested can be analysed with data which is more extensive than a simple digitization having two states.

It must be possible for this problem to be solved without increasing extraordinarily the number of elements of the circuit. The solution for this problem is that the logic analyser comprises a change-over circuit arranged between the probes and the digitizer, which permits associating several or all comparators with a given signal to be tested so as to extend its digitization to a multi-level logic system, the change-over circuit and the reference of each comparator being controlled by a control block.

Preferably, the change-over circuit is constituted by a matrix of MOS transfer gates or of field effect transistors (FET's). The field effect transistors may be MESFET's of gallium arsenide.

The advantage of the invention is that it permits of readily observing the transition times of the signals to be tested. The analog timing analysers are used to observe the digital signals and are generally constituted by two distinct parts:
a part for acquisition of the signal, which permits storing the digital data by the use of a sampling clock generator and comparators digitizing the analog input signal;
a part for starting the acquisition, which permits of selecting the useful part of the signal to be recorded and which operates by recognition of a predetermined event or group of events.

In order to permit simply determining the transition times, the multi-level logic system is, for example, a logic system having three states: high, medium and low.

A normal solution would consist in the systematic use of two comparators per probe to have available a digitization for two states and for three states followed by a selection of the digital data. However, this necessitates the use of 2N comparators and N multiplexers for N probes. Moreover, the large number of connections carrying high-frequency signals can give rise to realization problems. Therefore, according to the invention, the analog change-over system of the signals is inserted between the part of digitization of the signals and the input probes. It permits associating with an input signal either a single comparator (digitization at one threshold: two states) or two comparators (digitization at two thresholds, for example at 20% and 80% of the amplitude of the signal), which permits distinguishing three possible states: the high, low and middle states. It is also possible to associate all the comparators with a single signal to be tested and to operate according to a multilevel logic system. The modularity of the system permits configuring the instrument for two-state or multilevel mode observation with a given fairly small number of comparators. Without displacement of the probes, thus either a conventional mode (two states) signal or an extended mode (three states) signal can be examined. On the contrary, since several comparators are used for a single input path, the number of paths available is then reduced.

Preferably, the logic analyser has a number of probes equal to the number of comparators so that each probe associated with a comparator will permit digitizing a signal to be tested on a two-state logic system. The conversion to a digitization having three states necessitates associating two comparators with the same probe and hence leaving one probe unused. The conversion to a digitization having N states necessitates to associate N−1 comparators with the same probe and hence to leave N−2 probes unused. In order to operate an N-state logic system, it is necessary to use N−1 references, i.e. two references for a logic system having three states.

In order to present the information to the user when the multi-level logic system comprises a high state, a low state and at least one middle state limited by two reference levels, the said middle state is displayed on a display device by a straight line or a monotonic curve joining the two reference levels between the beginning and the end of the said middle state. The succession of monotonic curves can in turn constitute a monotonic curve.

The duration of the medium state is characteristic of the transition time of the signal. When this duration exceeds a predetermined value, this is characteristic of a defect. In order to avoid this defect, which may have a very low repetition rate, being missed by the user, the control block detects the defect and causes the analyser to display the situation so that the considered signal can be tested. Thus, when the duration of the medium state exceeds a predetermined duration, the display device is switched on to display this middle state.

In order that the invention may be readily carried out, it will now be described more fully with reference to the accompanying drawings, in which.

Figure 1A:
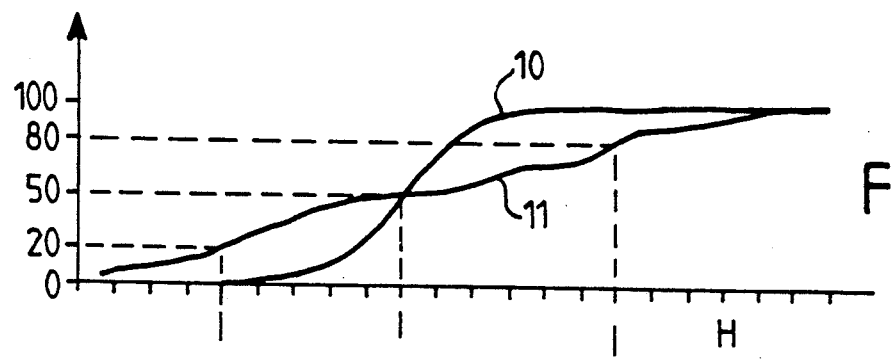
FIGS. 1A to 1D show a representation of a signal to be tested, of the signals digitized in two or three states and of the signal displayed on the display device.
Figure 1B:
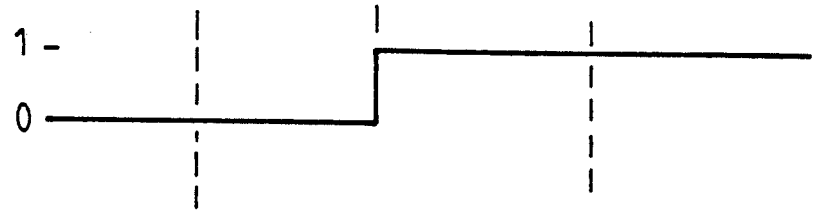

FIG. 1A shows a correct analog signal 10 and a defective signal 11. If a digitization of these two signals is carried out into two states by means of a comparator, in both cases the digitized signal of FIG. 1B is obtained with, for example, a reference level provided at 50% of the maximum excursion whilst supposing here that the two signals pass through substantially the same centre point. Therefore, it is not possible in this situation to differentiate a correct signal and a defective signal.

Figure 1C:
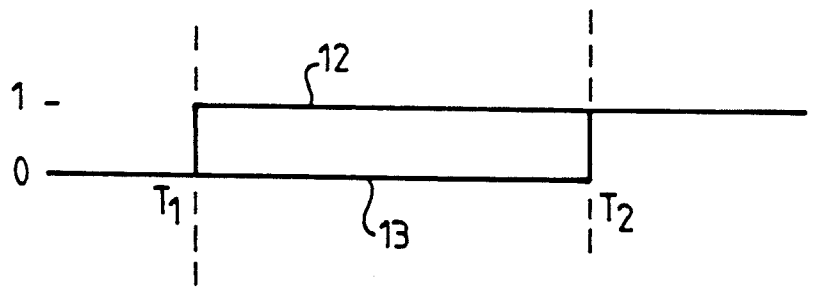

FIG. 1C on the contrary shows a digitization into three states by means of two comparators with two reference levels provided, for example, at 20% and at 80% of the maximum excursion. The digitized signals 12 and 13, respectively, are obtained for the reference levels at 20 and 80%.

Figure 2:
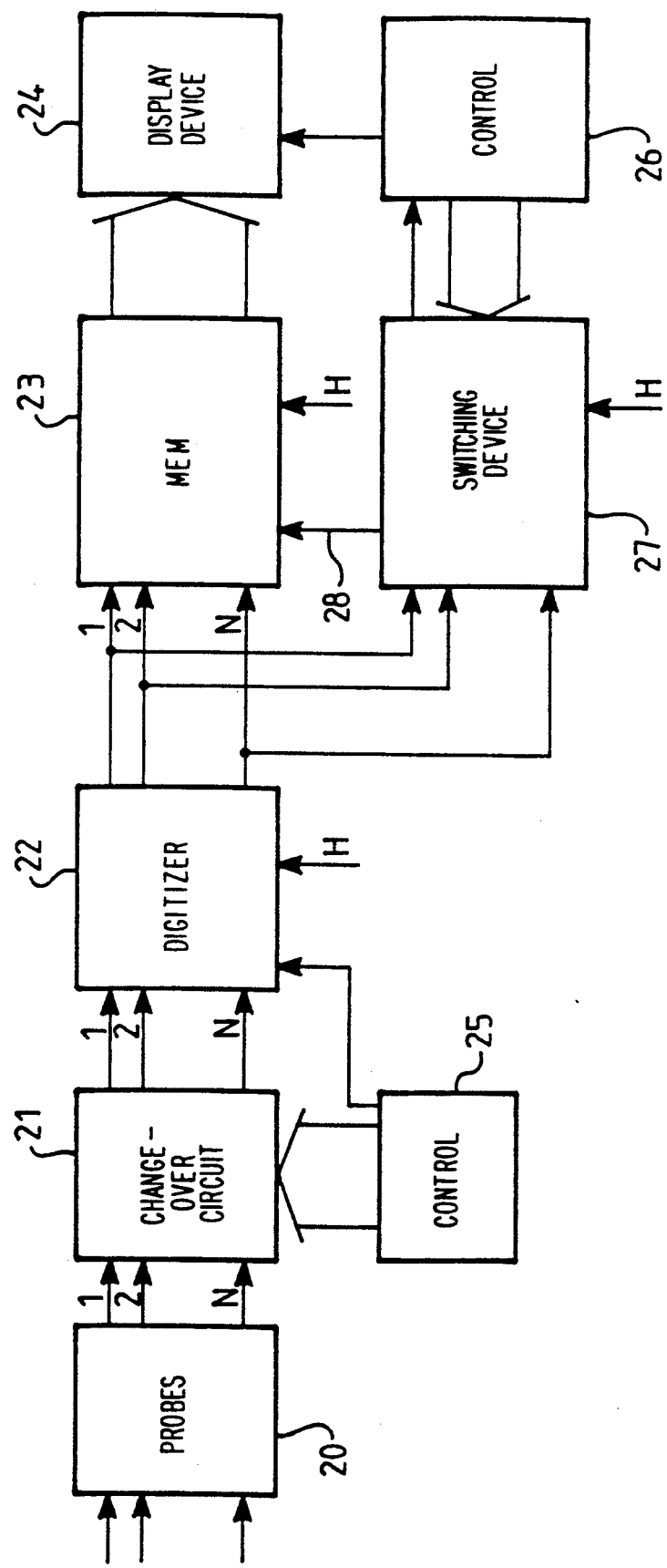
FIG. 2 shows a diagrammatic representation of a logic analyser according to the invention.

FIG. 2 shows a logic analyser comprising probes 20 connected to a change-over circuit 21 in turn connected to a digitizer 22. The digitized signals are stored in a memory 23 and displayed on a display device 24. A control block 25 will act simultaneously upon the change-over circuit 21 and upon the digitizer 22 to modify the reference levels.

Figure 3:
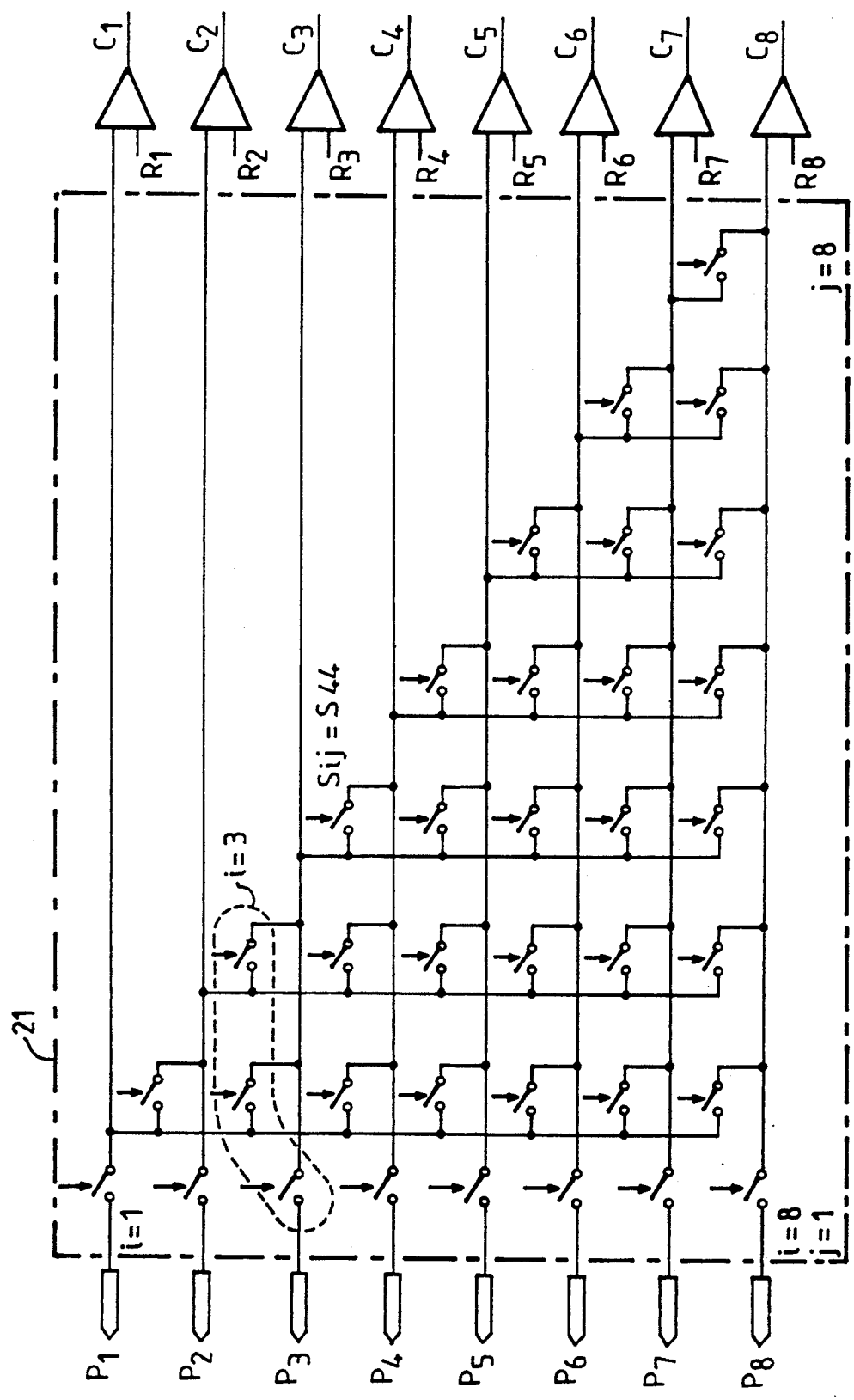
FIG. 3 shows in detail a representation of the change-over and digitization part according to the invention.

FIG. 3 shows in greater detail the change-over circuit 21. It is constituted by a matrix of switches $S_{ij}$ organized in i lines and j columns with j less than or equal to i. In order to describe the invention more clearly, the example shown has 8 lines and 8 columns, but is not limited by the number of probes to be connected. The minimum number is two probes, which are associated with two comparators. The probes $P_1$ to $P_8$ constitute eight input paths intended to be connected to signals to be tested. Each probe is connected to a switch of the first column. The output of the switch $S_{11}$ is connected to each of the seven switches of the second column. Each of these seven switches of the second column is connected by the other terminal to one of the seven paths after the switch $S_{i1}$ (i=2 to 8) arranged in this path. The other switches are connected in the same manner. The eighth column thus comprises a single switch $S_{88}$. The output of each switch $S_{11}$ to $S_{81}$ is connected to a comparator $C_1$ to $C_8$, which delivers the signal digitized according to the value of the reference level $R_1$ to $R_8$ associated therewith.

Several modes of operation are thus possible, of which only four are described by way of example.

EXAMPLE I 8-path 2-state mode

The invention permits the usual operation in which one comparator is associated with each path. All switches $S_{ii}$ are closed and all the remaining switchs are open. In this case, generally the reference levels are provided at 50%.

EXAMPLE 2

1-path 3-state mode and 6-path 2-state mode.

In this case, the comparator of one path is associated with another path and the corresponding probe, for example $P_5$, is inactive although it can remain physically in contact with its signal. Therefore there is:
$S_{11}$ and $R_1$ at, for example, 20%,
$S_{52}$ closed and $R_5$ at, for example, 80%.

All the other switches $S_{5j}$ are open. The other paths operate as in Example 1.

EXAMPLE 3

4-path 3-state mode.
For example:

$C_1$ and $C_3$ are associated with the path 1.
and then $S_{11}$: closed    $S_{32}$: closed    $S_{31}$: open
$C_2$ and $C_6$ are assooiated with the path 2.

-continued and then $S_{21}$: closed    $S_{63}$: closed    $S_{61}$: open.
$C_4$ and $C_7$ are associated with the path 4
and then $S_{41}$: closed    $S_{75}$: closed    $S_{71}$: open
$C_5$ and $C_8$ are associated with the path 5
and then $S_{51}$: closed    $S_{86}$: closed    $S_{81}$: open.

All the other switches are open.

EXAMPLE 4

1-path 9-state mode.

$S_{11}$ and all the switches of column 2 are closed and the reference levels $R_1$ to $R_8$ are provided at different values.

If 8 comparators are used, 6 possible modes can be chosen:
8-path 2-state mode.
6-path 2-state mode and 1-path 3-state mode.
4-path 2-state and 2-path 3-state mode.
2-path 2-state mode and 3-path 3-state mode.
4-path 3-state mode.
1-path 9-state mode.

In all these examples, each operator must have its reference provided at a given value, which depends upon the digitization it carries out. This is realized by the control block 25 (FIG. 2), which also acts upon the open or closed state of each switch.

In a multi-level digitization having three states, for example, the digitized signal delivered by each comparator will have a variation shown in FIG. 1C. Before an instant $T_1$, the two comparators are at 0 (low state); after an instant $T_2$, the two comparators are at 1 (high state). Between $T_1$ and $T_2$, one of the comparators is at 0 and the other at 1 (middle state).

Figure 1D:

The control means 26 (FIG. 2) of the logic analyser will permit display on the display device 24 a segment of a straight line or of a curve connecting the level 0 at the instant $T_1$ to the level 1 at the instant $T_2$ (FIG. 1D), in order to present to the user the result of the digitization.

On the other hand, with the digitizer 22 (FIG. 2) operating under the control of a clock generator H, the duration between $T_1$ and $T_2$ can be determined according to a number of periods of the clock generator H.

This duration will be compared in a switching device 27 (FIG. 2), which derives the data at the output of the digitizer 22 and determines whether the duration $T_1 T_2$ exceeds a given value. In the affirmative case, the transition time of the signal to be tested is too long and the switching device acts (connection 28) so that the memory is read for this event and the latter is displayed on the screen. The defective signals are thus automatically displayed, which is very important when such an event has a low rate of repetition. The switching device 27 and the memory 23 are also controlled by the clock generator H.

We claim:
1. A multi-level logic analyzer comprising:
  a plurality of probes each for sensing separate signals to be tested,
  a digitizer for receiving and digitizing the signals, said digitizer including a plurality of comparators exceeding two in number each for carrying out a digitization of the signal in comparison with a reference value applied to the comparator, said comparators outputting a different level signal when the applied reference value is different.

a change-over circuit connected between the probes and the digitizer, said change-over circuit comprising means for selectively coupling one or more of the probes to one or more of the comparators, a control block connected to the change-over circuit and the comparators for controlling the change-over circuit and the reference value applied to each comparator, whereby the signal or signals received on the probes can be digitized into two states, into two or three states, or into a number of states substantially equal to the number of comparators.

2. A logic analyser as claimed in claim 1, characterized in that the change-over circuit is constituted by a matrix of MOS transfer gates or field effect transistors (FET's).

3. A logic analyser as claimed in claim 2, characterized in that the field effect transistors are MESFET's of gallium arsenide.

4. A multi-level logic analyzer as claimed in claim 1, wherein the change-over circuit includes a logic circuit under control of the control block for connecting each probe to a different comparator, or one probe to all the comparators.

5. A multi-level logic analyzer as claimed in claim 4, wherein the number of probes and comparators are each equal to eight.

6. The logic analyzer of claim 1, wherein
a) the three states comprises a digitization of signals according to a high state, a low state, and at least one middle state delimited by respective first and second reference levels, and
b) the logic analyzer further comprises
   i) a display device,
   ii) means for indicating the middle state on the display device as a monotonic curve in the time domain between a point representing the first reference level and a point representing the second reference level.

7. The logic analyzer of claim 6, wherein said monotonic curve is a straight line.

8. The logic analyzer of claim 6, wherein when said middle state lasts for a time interval which exceeds a predetermined duration, the display device is automatically switched on to display said middle state.

* * * * *